(12) United States Patent
Oberhuber et al.

(10) Patent No.: US 8,514,120 B2
(45) Date of Patent: Aug. 20, 2013

(54) DIGITAL-TO-ANALOG CONVERTER WITH A SHARED RESISTOR STRING

(75) Inventors: Ralph G. Oberhuber, Plano, TX (US); Tsedeniya A. Abraham, Dallas, TX (US); Mark Shill, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 13/291,853

(22) Filed: Nov. 8, 2011

(65) Prior Publication Data

US 2013/0113643 A1    May 9, 2013

(51) Int. Cl.
*H03M 1/66* (2006.01)
(52) U.S. Cl.
USPC .......................................... 341/144; 341/154
(58) Field of Classification Search
USPC .................. 341/144, 154; 345/87, 88, 98
See application file for complete search history.

(56) References Cited

U.S. PATENT DOCUMENTS

| | | |
|---|---|---|
| 6,937,178 B1 | 8/2005 | Rempfer et al. |
| 7,002,832 B2 * | 2/2006 | Wuidart et al. ............... 365/100 |
| 7,079,062 B2 * | 7/2006 | Panov et al. .................. 341/144 |
| 7,259,706 B2 | 8/2007 | Haurie et al. |
| 7,345,907 B2 * | 3/2008 | Scheuerlein .................. 365/148 |
| 7,414,561 B1 | 8/2008 | Brubaker |
| 7,532,140 B1 | 5/2009 | Rempfer et al. |
| 8,237,596 B2 * | 8/2012 | Zhao et al. .................... 341/145 |

* cited by examiner

*Primary Examiner* — Brian Young
(74) *Attorney, Agent, or Firm* — Alan A. R. Cooper; Wade J. Brady, III; Frederick J. Telecky, Jr.

(57) ABSTRACT

An apparatus is provided that comprises resistors, a first set of switches, and a second set of switches. The resistors are arranged in an array having columns and rows, where the number of resistors is an integer multiple of the number of columns or rows. The resistors are coupled together in a skip-K pattern. Each switch from the first and second sets of switches is coupled to the resistor string, and the first and second sets of switches are each arranged in a sequence and are offset from one another by an offset value. The first and second sets of switches are arranged along the periphery of the array such that each switch from the first set of switches is located in proximity to and is associated with the same row or the same column as its corresponding switch in the sequence from the second set of switches.

20 Claims, 6 Drawing Sheets

| | | | | | | | | | |
|---|---|---|---|---|---|---|---|---|---|
| 17 | 49 | 81 | 113 | 145 | 177 | 209 | 241 | 273 | 305 |
| 304 | 272 | 240 | 208 | 176 | 144 | 112 | 80 | 48 | 16 |
| 18 | 50 | 82 | 114 | 146 | 178 | 210 | 242 | 274 | 306 |
| 303 | 271 | 239 | 207 | 175 | 143 | 111 | 79 | 47 | 15 |
| ○ ○ ○ | ○ ○ ○ | ○ ○ ○ | ○ ○ ○ | ○ ○ ○ | ○ ○ ○ | ○ ○ ○ | ○ ○ ○ | ○ ○ ○ | ○ ○ ○ |
| 31 | 63 | 95 | 127 | 159 | 191 | 223 | 255 | 287 | 319 |
| 288 | 256 | 226 | 194 | 162 | 129 | 98 | 66 | 34 | 2 |
| 32 | 64 | 96 | 128 | 160 | 192 | 224 | 256 | 288 | 320 |
| 289 | 257 | 225 | 193 | 161 | 129 | 97 | 65 | 33 | 1 |

RESISTOR ARRAY 106

END OF RESISTOR STRING 105
BEGINNING OF RESISTOR STRING 105

DIGITAL-TO-ANALOG CONVERTER WITH A SHARED RESISTOR STRING

TECHNICAL FIELD

The invention relates generally to digital-to-analog converters (DACs) and, more particularly, to DACs having a shared resistor strings.

BACKGROUND

DACs are commonplace circuits that are employed in a variety of applications. Typically, DACs comprise switched voltage dividers that output an analog signal based on a digital signal. The voltage dividers can, for example, be resistor strings or resistor ladders (commonly referred to as R-2R resistor ladders), and the resolution can be increased by increasing the number of voltage levels output from the DAC. With increasing resolution, though, there is an increase in area or size, so it is highly desirable to have a DAC with high resolution and low area. Some conventional DACs are: U.S. Pat. Nos. 6,937,178; 7,259,706; 7,414,561 7,532,140.

SUMMARY

An embodiment of the present invention, accordingly, provides an apparatus. The apparatus comprises a plurality of resistors arranged in an array having a plurality of columns and a plurality of rows, and wherein the plurality of resistors are coupled together in a skip-K pattern to form a resistor string; a first set of switches, wherein each switch from the first set of switches is coupled to the resistor string; and a second set of switches, wherein each switch from the second set of switches is coupled to the resistor string, and wherein the first and second sets of switches are each arranged in a sequence and are offset from one another by an offset value, and wherein the first and second sets of switches are arranged along the periphery of the array such that each switch from the first set of switches is located in proximity to and is associated with the same row or the same column as its corresponding switch in the sequence from the second set of switches, and wherein the number of resistors is at least one of an integer multiple of at least one of the number of columns and the number of rows or a fraction of the offset value.

In accordance with an embodiment of the present invention, the first and second switches are arranged in a plurality of interleaved columns along an edge of the array.

In accordance with an embodiment of the present invention, the apparatus further comprises: a first buffer that is coupled to each switch from the first set of switches; and a second buffer that is coupled to each switch from the second set of switches.

In accordance with an embodiment of the present invention, K is 2, and the offset value is 64.

In accordance with an embodiment of the present invention, each resistor further comprises a silicon chromium resistor.

In accordance with an embodiment of the present invention, the at least one switch from each of the first and second sets of transistors is a transmission gate.

In accordance with an embodiment of the present invention, an apparatus is provided. The apparatus comprises a first output that is configured to generate voltages within a first range; a second output that is configured to generate voltages within a second range, wherein the first and second ranges are offset from one another by an offset voltage; a plurality of resistor rows, wherein each resistor row includes a set of resistors, and wherein the resistors from each set of resistors are coupled together in a skip-K pattern to form a resistor string, and wherein the number of resistors is an integer multiple of the number of rows; a plurality of switches that are each coupled to the resistor string, wherein the plurality of switches includes: a first switch that is coupled to a first resistor from a first resistor row of the plurality of resistor rows and that is configured to provide a first voltage within the first range to the first output; and a second switch that is coupled to a second resistor from the first resistor row of the plurality of resistor rows and that is configured to provide a second voltage within the second range to the second output, wherein the first and second resistors are separated from one another by a predetermined set of resistors, wherein the number of resistors within the predetermined set is a function of K, the number of resistor rows, and the offset voltage, and wherein the difference between the first and second voltage is approximately equal to the offset voltage.

In accordance with an embodiment of the present invention, the plurality of switches further comprises a first set of switches and a second set of switches, and wherein the first set of switches includes the first switch, and wherein the second set of switches includes the second switch.

In accordance with an embodiment of the present invention, the apparatus further comprises: a first buffer that is coupled between each switch from the first set of switches and the first output; and a second buffer that is coupled between each switch from the second set of switches and the second output.

In accordance with an embodiment of the present invention, the first and second sets of switches are arranged in a sequence such that the difference between voltages output from corresponding switches in the sequence for the first and second sets is approximately equal to the offset voltage.

In accordance with an embodiment of the present invention, the offset voltage is associated with an offset value.

In accordance with an embodiment of the present invention, the number of rows is 32.

In accordance with an embodiment of the present invention, digital-to-analog converter (DAC) is provided. The DAC comprises a decoder that is configured to receive a digital signal; a resolution circuit that is coupled to the decoder and that is configured to generate an analog signal, wherein the resolution circuit has: a first output that is configured to generate voltages within a first range; a second output that is configured to generate voltages within a second range, wherein the first and second ranges are offset from one another by an offset voltage; a plurality of resistor rows, wherein each resistor row includes a set of resistors, and wherein the resistors from each set of resistors are coupled together in a skip-K pattern to form a resistor string, and wherein the number of resistors is an integer multiple of the number of rows; a plurality of switches that are each coupled to the resistor string and that are controlled by an output signal from the decoder, wherein the plurality of switches includes: a first switch that is coupled to a first resistor from a first resistor row of the plurality of resistor rows and that is configured to provide a first voltage within the first range to the first output; and a second switch that is coupled to a second resistor from the first resistor row of the plurality of resistor rows and that is configured to provide a second voltage within the second range to the second output, wherein the first and second resistors are separated from one another by a predetermined set of resistors, wherein the number of resistors within the predetermined set is a function of K, the number of resistor rows, and the offset voltage, and wherein the difference between the first and second voltage is approximately equal to the offset voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 1:
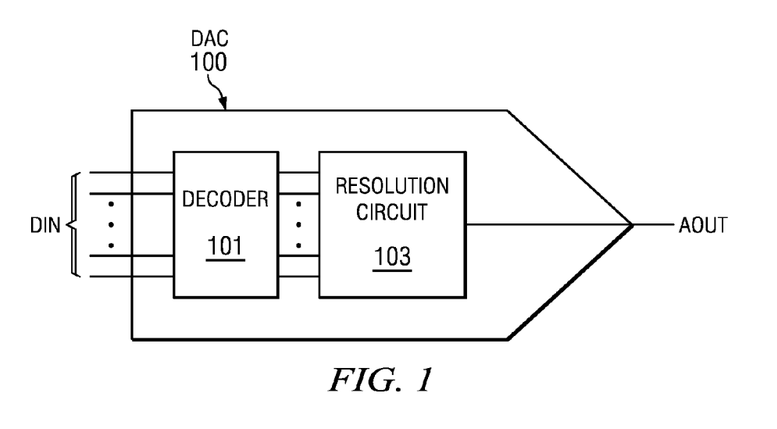
FIG. 1 is a diagram of an example of a DAC in accordance with an embodiment of the present invention.
Figure 2:
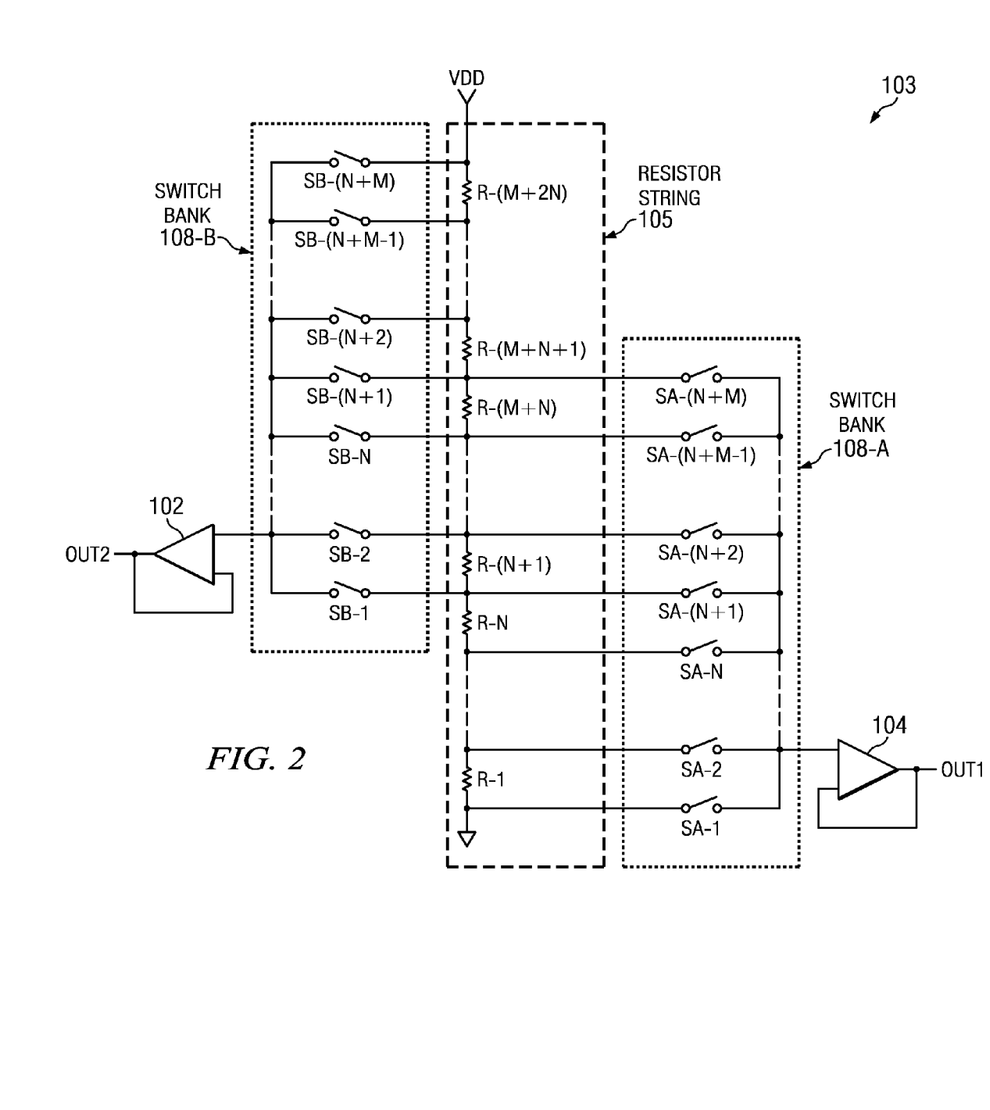
FIGS. 2 and 3 are diagrams of an example of the resolution circuit of FIG. 1.

Turning to FIGS. 1 and 2, an example of a DAC 100 in accordance with an embodiment of the present invention can be seen. As shown, the DAC 100 generally comprises a decoder 101 and resolution circuit 103. The decoder 101 is generally configured to receive the digital input signal DIN and generate a control signal that controls the switches within resolution circuit 103 to generate the analog output signal AOUT. The resolution circuit 103 generally includes a resistor string 105 that includes resistors R-1 to R-(M+2N) coupled together in series with one another between two voltage rails (i.e., VDD and ground). As shown, this resolution circuit 103 is able to generate two output signals OUT1 and OUT2 from buffers 102 and 104 (which may be differential and coupled across a selected resistor and may be an interpolating buffer); more output signals may also be possible. These output signals OUT1 and OUT2 (which can be referred to as the A-side and B-side) are generated from separate sets of switches or switch banks SA-1 to SA-(N+M) and SB-1 to SB-(N+M) (which can be transmission gates or transistor switches, such as an NMOS transistor). In this configuration, there is an offset voltage between A-side and B-side that results in the A-side and B-side being able to output voltages within different ranges. For example, assuming that the supply voltage from rail VDD is about 5V, the offset voltage can be about 1V, where the voltage range for the A-side is about 0V to about 4V and the voltage range for the B-side is about 1V to about 5V. This offset voltage is generally achieved by having an offset value in the number of resistors. For example, using the voltage ranges for the A-side and B-side illustrated above and using a resistor string having 320 resistors, the offset value for the number of resistors can be 64, where the A-side would use resistors R-1 to R-256 and the B-side would use resistors R-65 to R-320. Additionally, for the example configuration shown in FIGS. 1 and 2, the A-side and B-side each use the same number of resistors (i.e., N+M, where M resistors overlap), but it is also possible to have differing numbers of resistors as well as other "sides" (such as a C-side, D-side, and so forth).

Figure 3:
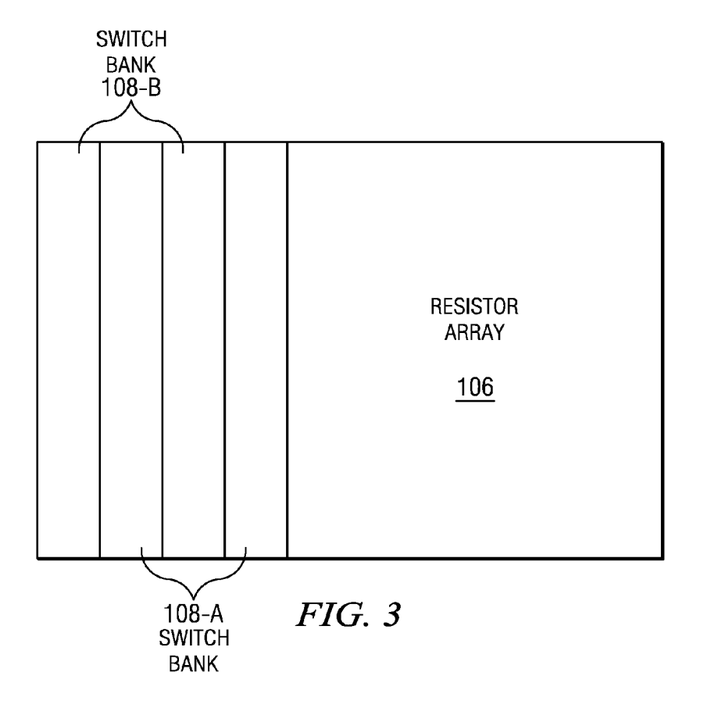
Figure 4:
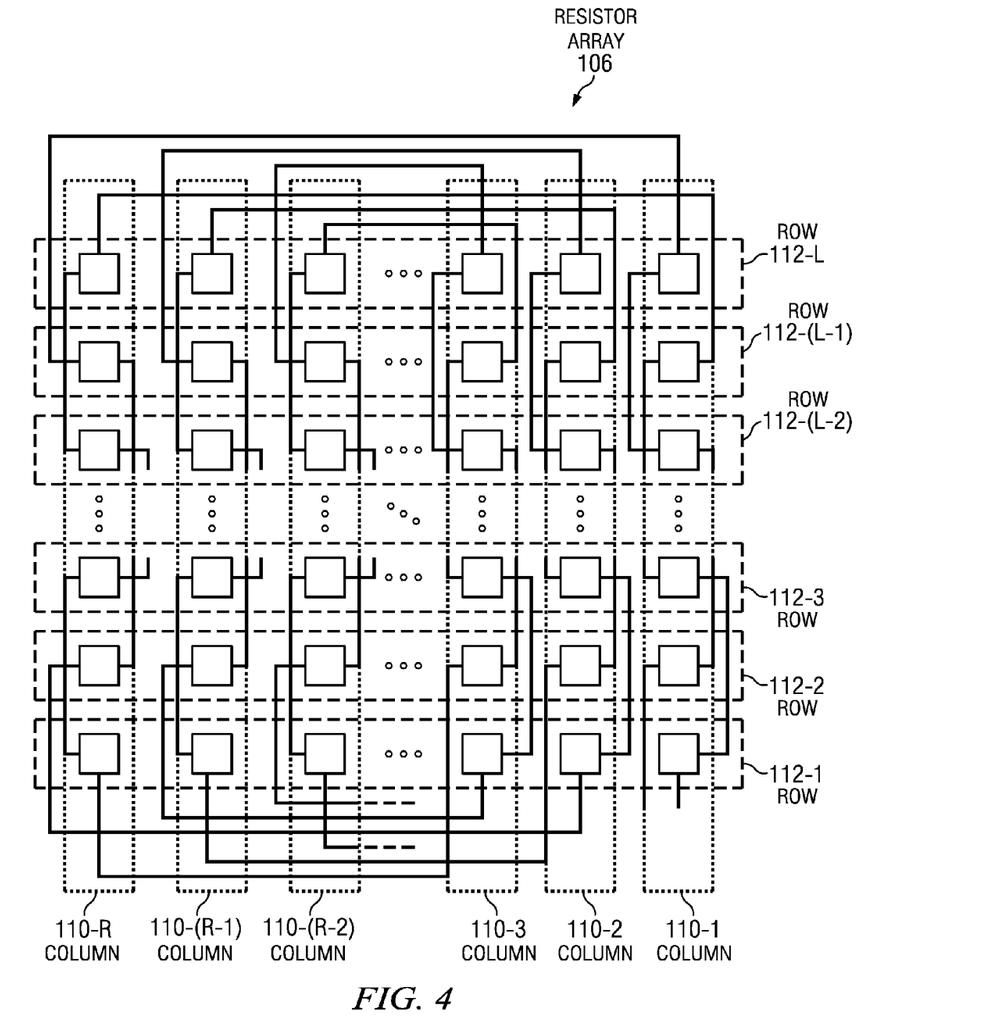
FIG. 4 is a diagram of an example of the resistor array of FIGS. 2 and 3 using a skip-2 pattern.

In order to fabricate this DAC 100, resistor string 105 is typically laid out as a resistor array 106 (which has columns and rows), as shown in FIG. 3. In this configuration, switch banks 108-A and 108-B are adjacent to an edge of the array 106 and interleaved with one another. With array 106, resistive gradients in the directions of the columns and rows of array 106 can be present due to process variances in the manufacturing of the array 106. These resistive gradients can result in inaccuracies in the resistor string 105 if linearly coupled together according to the column or row layout. To combat this issue, the resistors R-1 to R-(N+M) are coupled together in a skip-K pattern (where K is the skip number). An example of a skip-2 wiring pattern in the column direction is shown in FIG. 4. As shown in this example, the array 106 includes columns 110-1 to 110-R and rows 112-1 to 112-L, and, looking to the resistor at row 112-1 and column 110-1 as an example, it is coupled to the resistor at column 110-1 and row 112-3, skipping the resistor at column 110-1 and row 112-2. This skipping is continued until the last row 112-L, and, then, it loops to the last column 110-2. This coupling continues in this spiral pattern until the "middle" is reached, at which point the spiral pattern reverses direction. An example of a resistor array 106 using a skip-2 pattern for a resistor string 105 having 320 resistors can be seen in FIG. 5, where the reversing in the "middle" is denoted by the arrows. Other skip-K patterns, such as skip-4 or skip-8 may be advantageously employed with resistor strings 105 of various lengths. The skip-K pattern can also be applied in the row direction as well, and dummy resistors may also be placed along the periphery of the array 106 to compensate for overetching or other process-related issues.

By using this skip-K pattern, the effect of resistive gradients in the directions of the columns 110-1 to 110-110-R and in the direction of the rows 112-1 to 112-L can be reduced, and the switches SA-1 to SA-(N+M) and SB-1 to SB-(N+M) may be advantageously arranged to reduce the amount of area employed for routing. By having the total number of resistors in resistor string 105 be an integer multiple of the number of rows (or columns if the switches SA-1 to SA-(N+M) and SB-1 to SB-(N+M) are arranged to be associated with columns) or be a fraction of the offset value, associated switches (such as switches SA-1 and SB-1) can be associated with the same row (or column if the switches SA-1 to SA-(N+M) and SB-1 to SB-(N+M) are arranged to be associated with columns) with separation where the number of resistors in the separation is a function of the number of rows, the skip number K, and offset. Switches that are coupled to the same resistor (i.e., switches SA-97 and SB-33 shown in the example of FIG. 6) may also be coupled to one another at the periphery of the array 106 to further reduce the size of the routing channel.

Figure 5:
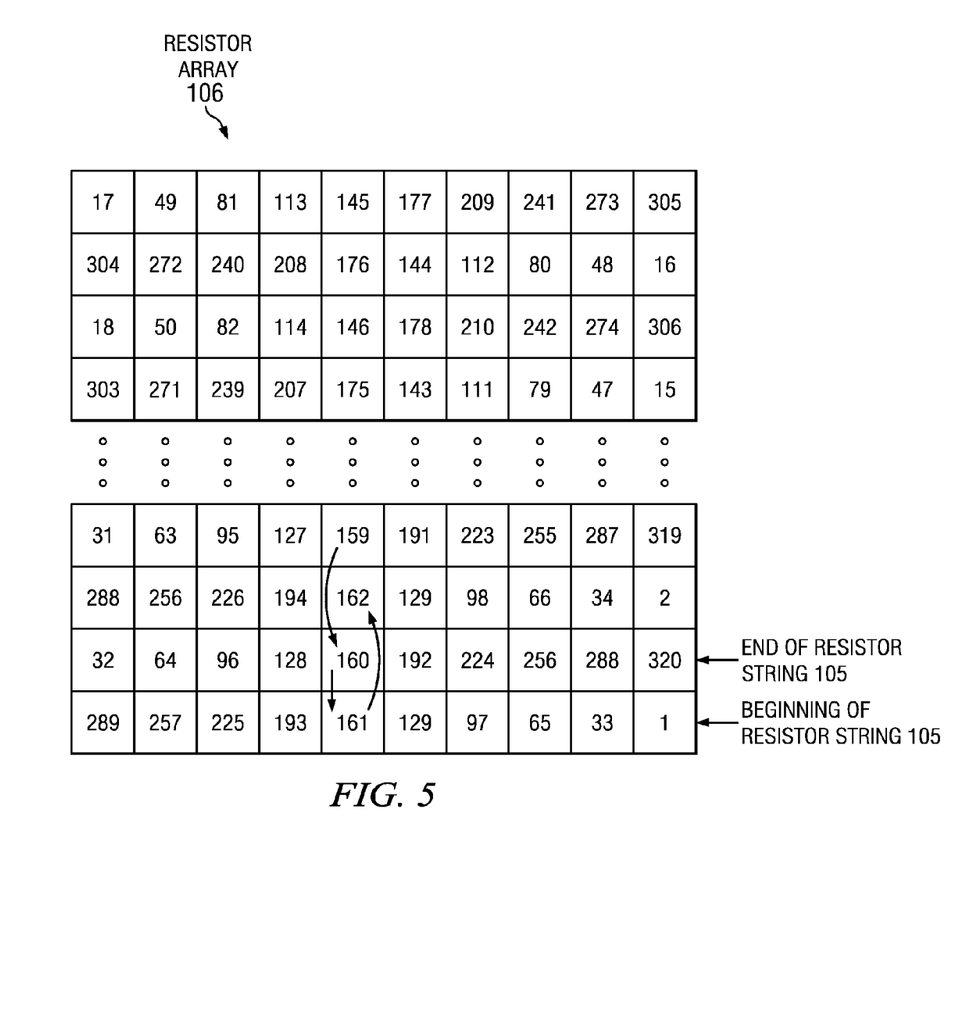
FIG. 5 is a diagram of an example of the resistor array of FIG. 4 having 32 rows and 10 columns.
Figure 6:
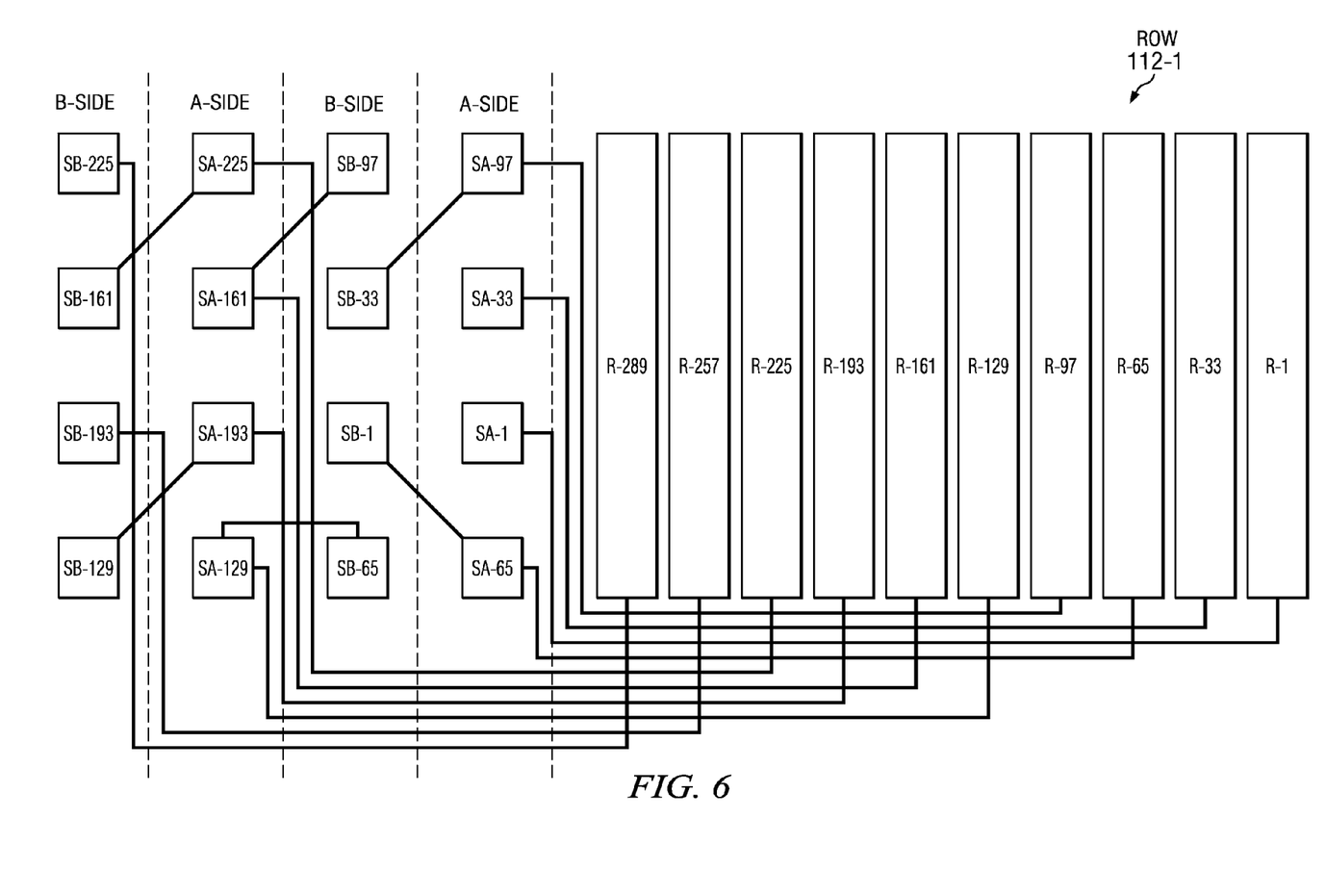
FIGS. 6 and 7 are diagrams of example of the arrangement of rows and switching circuits for the resistor array of FIG. 5.
Figure 7:
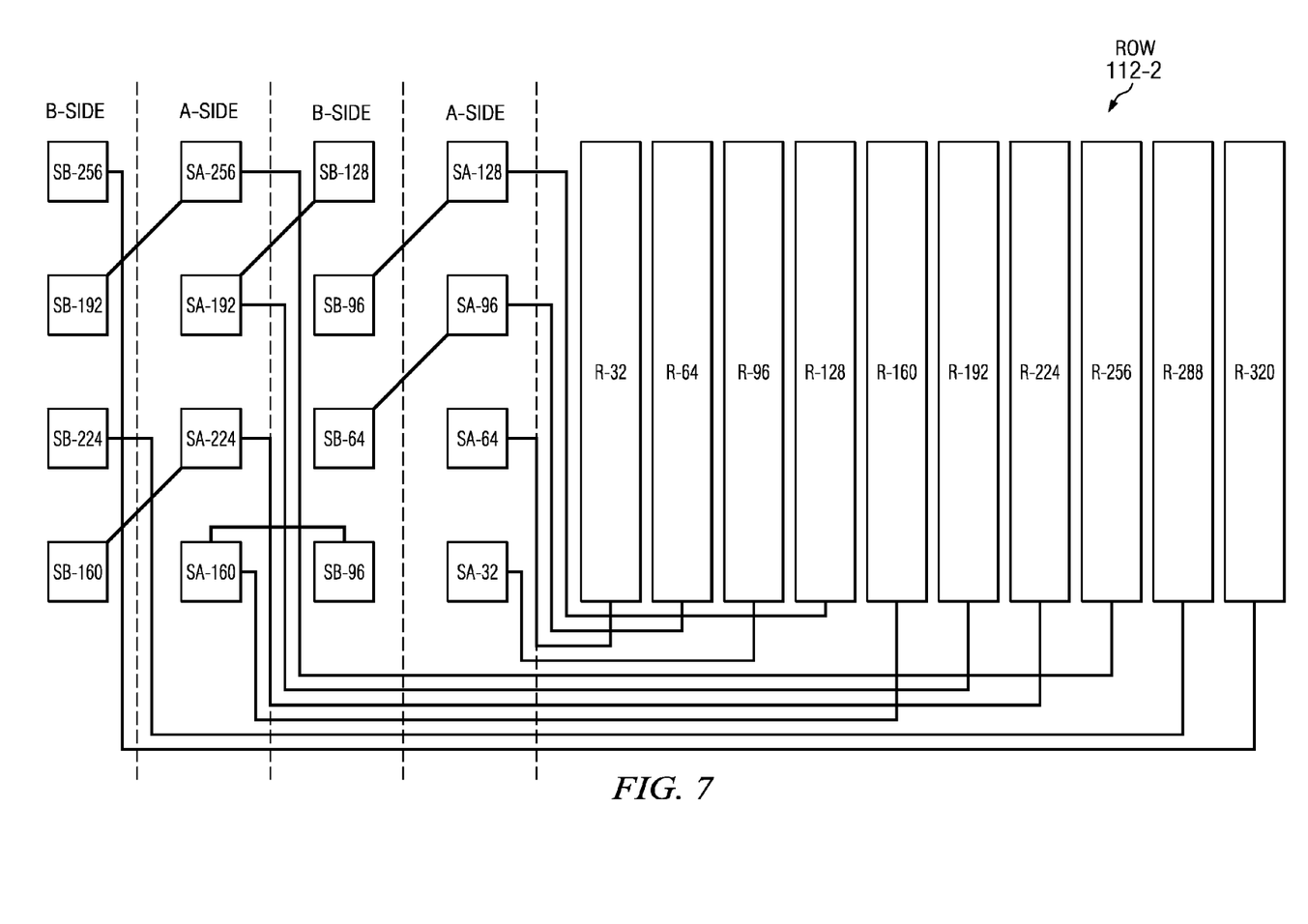

Turning to FIGS. 6 and 7, example arrangements for switch routing for rows 112-1 and 112-2 for the example array 106 of FIG. 5 that uses a skip-2 pattern with 320 resistors can be seen. In this example, the array 106 has 10 columns and 32 rows, where total number of resistors (320) is an integer multiple of the number of rows (32) and is a fraction (½) of the offset value (64). Resistors R-1, R-33, R-65, R-97, R-129, R-161, R-193, R-257, and R-289 are present in row 112-1, while resistors R-32, R-64, R-96, R-128, R-160, R-192, R-224, R-256, and R-320 are present in row 112-2. In row 112-1, resistors R-1 and R-33 are used for the A-side (which for this example has a voltage range between about 0V and about 4V). Resistor R-1 is the first resistor for the A-side (which is associated with and coupled to the first switch SA-1), and resistor R-65 is the first resistor for the B-side (which is associated with and coupled to switch SB-1). As shown, these switches SA-1 and SB-1 are in proximity to (i.e., adjacent to) one another and can (for example) be activated by the same selection signal. Because resistor R-65 is shared by the A-side and B-side, the associated A-side switch (namely, switch SA-65) is in proximity to switch SA-1. For this example, resistor R-33 separates resistors R-1 and R-65, and this separation is a function of the number of rows (32), the skip number K (2), and offset value (64). For the configuration shown in this example, NMOS transistor switches can be used for voltages ranging from about 0V to about 2.5V, and transmission gates can be used for voltages ranging from about 2.5V to about 5V so as to further reduce area. This pattern can be throughout the examples shown for rows 112-1 and 112-2.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a plurality of resistors arranged in an array having a plurality of columns and a plurality of rows, and wherein the plurality of resistors are coupled together in a skip-K pattern to form a resistor string;
a first set of switches, wherein each switch from the first set of switches is coupled to the resistor string; and
a second set of switches, wherein each switch from the second set of switches is coupled to the resistor string, and wherein the first and second sets of switches are each arranged in a sequence and are offset from one another by an offset value, and wherein the first and second sets of switches are arranged along the periphery of the array such that each switch from the first set of switches is located in proximity to and is associated with the same row or the same column as its corresponding switch in the sequence from the second set of switches, and wherein the number of resistors is at least one of an integer multiple of at least one of the number of columns and the number of rows or a fraction of the offset value.

2. The apparatus of claim 1, wherein the first and second switches are arranged in a plurality of interleaved columns along an edge of the array.

3. The apparatus of claim 2, wherein the apparatus further comprises:
a first buffer that is coupled to each switch from the first set of switches; and
a second buffer that is coupled to each switch from the second set of switches.

4. The apparatus of claim 3, wherein K is 2, and the offset value is 64.

5. The apparatus of claim 4, wherein each resistor further comprises a silicon chromium resistor.

6. The apparatus of claim 5, wherein the at least one switch from each of the first and second sets of transistors is a transmission gate.

7. An apparatus comprising:
a first output that is configured to generate voltages within a first range;
a second output that is configured to generate voltages within a second range, wherein the first and second ranges are offset from one another by an offset voltage;
a plurality of resistor rows, wherein each resistor row includes a set of resistors, and wherein the resistors from each set of resistors are coupled together in a skip-K pattern to form a resistor string, and wherein the number of resistors is an integer multiple of the number of rows;
a plurality of switches that are each coupled to the resistor string, wherein the plurality of switches includes:
a first switch that is coupled to a first resistor from a first resistor row of the plurality of resistor rows and that is configured to provide a first voltage within the first range to the first output; and
a second switch that is coupled to a second resistor from the first resistor row of the plurality of resistor rows and that is configured to provide a second voltage within the second range to the second output, wherein the first and second resistors are separated from one another by a predetermined set of resistors, wherein the number of resistors within the predetermined set is a function of K, the number of resistor rows, and the offset voltage, and wherein the difference between the first and second voltage is approximately equal to the offset voltage.

8. The apparatus of claim 7, wherein the plurality of switches further comprises a first set of switches and a second set of switches, and wherein the first set of switches includes the first switch, and wherein the second set of switches includes the second switch.

9. The apparatus of claim 8, the apparatus further comprises:
a first buffer that is coupled between each switch from the first set of switches and the first output; and
a second buffer that is coupled between each switch from the second set of switches and the second output.

10. The apparatus of claim 9, wherein the first and second sets of switches are arranged in a sequence such that the difference between voltages output from corresponding switches in the sequence for the first and second sets is approximately equal to the offset voltage.

11. The apparatus of claim 10, wherein the offset voltage is associated with an offset value.

12. The apparatus of claim 11, wherein K is 2 and the offset value is 64.

13. The apparatus of claim 12, wherein the number of rows is 32.

14. A digital-to-analog converter (DAC) comprising:
a decoder that is configured to receive a digital signal;
a resolution circuit that is coupled to the decoder and that is configured to generate an analog signal, wherein the resolution circuit has:
a first output that is configured to generate voltages within a first range;
a second output that is configured to generate voltages within a second range, wherein the first and second ranges are offset from one another by an offset voltage;

a plurality of resistor rows, wherein each resistor row includes a set of resistors, and wherein the resistors from each set of resistors are coupled together in a skip-K pattern to form a resistor string, and wherein the number of resistors is an integer multiple of the number of rows;

a plurality of switches that are each coupled to the resistor string and that are controlled by an output signal from the decoder, wherein the plurality of switches includes:

a first switch that is coupled to a first resistor from a first resistor row of the plurality of resistor rows and that is configured to provide a first voltage within the first range to the first output; and     a second switch that is coupled to a second resistor from the first resistor row of the plurality of resistor rows and that is configured to provide a second voltage within the second range to the second output, wherein the first and second resistors are separated from one another by a predetermined set of resistors, wherein the number of resistors within the predetermined set is a function of K, the number of resistor rows, and the offset voltage, and wherein the difference between the first and second voltage is approximately equal to the offset voltage.

15. The DAC of claim 14, wherein the plurality of switches further comprises a first set of switches and a second set of switches, and wherein the first set of switches includes the first switch, and wherein the second set of switches includes the second switch.

16. The DAC of claim 15, the apparatus further comprises:
    a first buffer that is coupled between each switch from the first set of switches and the first output; and
    a second buffer that is coupled between each switch from the second set of switches and the second output.

17. The DAC of claim 16, wherein the first and second sets of switches are arranged in a sequence such that the difference between voltages output from corresponding switches in the sequence for the first and second sets is approximately equal to the offset voltage.

18. The DAC of claim 17, wherein the offset voltage is associated with an offset value.

19. The DAC of claim 18, wherein K is 2 and the offset value is 64.

20. The DAC of claim 19, wherein the number of rows is 32.

* * * * *